US008718815B2

(12) United States Patent
Shimamura

(10) Patent No.: US 8,718,815 B2
(45) Date of Patent: May 6, 2014

(54) AUTOMATED WAREHOUSE SYSTEM

(75) Inventor: Kazunori Shimamura, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 13/144,109

(22) PCT Filed: Nov. 18, 2009

(86) PCT No.: PCT/JP2009/006191
§ 371 (c)(1),
(2), (4) Date: Jul. 12, 2011

(87) PCT Pub. No.: WO2010/084542
PCT Pub. Date: Jul. 29, 2010

(65) Prior Publication Data
US 2011/0270438 A1    Nov. 3, 2011

(30) Foreign Application Priority Data

Jan. 23, 2009  (JP) ................................ 2009-013023

(51) Int. Cl.
*B65G 1/137*   (2006.01)

(52) U.S. Cl.
USPC .......................................... 700/214; 700/236

(58) Field of Classification Search
USPC .............. 700/214, 112; 414/267, 273, 222.07
See application file for complete search history.

(56) References Cited

U.S. PATENT DOCUMENTS

| | | | | |
|---|---|---|---|---|
| 5,403,147 A * | 4/1995 | Tanaka | ........................... | 414/807 |
| 6,579,052 B1 * | 6/2003 | Bonora et al. | ........... | 414/222.01 |
| 7,660,646 B2 * | 2/2010 | Lee et al. | ....................... | 700/214 |
| 7,966,090 B2 * | 6/2011 | Wang et al. | .................... | 700/112 |
| 8,070,410 B2 * | 12/2011 | Rebstock | ....................... | 414/281 |
| 8,204,617 B2 * | 6/2012 | Teferra et al. | ................. | 700/112 |

(Continued)

FOREIGN PATENT DOCUMENTS

| | | |
|---|---|---|
| EP | 0 520 736 A1 | 12/1992 |
| JP | 61-229705 A | 10/1986 |

(Continued)

OTHER PUBLICATIONS

English translation of Official Communication issued in corresponding International Application PCT/JP2009/006191, mailed on Aug. 18, 2011.

(Continued)

*Primary Examiner* — Ramya Burgess
*Assistant Examiner* — Thomas Randazzo
(74) *Attorney, Agent, or Firm* — Keating & Bennett, LLP

(57) ABSTRACT

An automated warehouse system having an improved cycle efficiency of storing and retrieving articles to and from the automated warehouse system includes a storage station, a retrieval station, a plurality of article storage shelves, a stacker crane, and a system controller. An article is brought to the storage station to be stored and retrieved from the retrieval station. The article storage shelves store articles. The stacker crane can move an article between the storage station, the retrieval station, and the article storage shelves. The system controller keeps track of the amount of storage time articles have been stored and, when it determines that an article has been stored on an article storage shelf in a buffer area for a first predetermined amount of time or longer, the system controller controls the stacker crane such that the stacker crane carries the article from an article storage shelf in the buffer area to an article storage shelf in the first storage area.

4 Claims, 6 Drawing Sheets

(56) References Cited

U.S. PATENT DOCUMENTS

| | | | |
|---|---|---|---|
| 8,396,585 B2* | 3/2013 | Antony et al. | 700/216 |
| 2006/0190118 A1 | 8/2006 | Teferra et al. | |
| 2007/0010909 A1* | 1/2007 | Bonora et al. | 700/228 |
| 2008/0228310 A1 | 9/2008 | Wang et al. | |
| 2009/0067957 A1* | 3/2009 | Ando | 414/222.05 |
| 2009/0265031 A1* | 10/2009 | Tachibana et al. | 700/214 |
| 2009/0307265 A1* | 12/2009 | Nicholson et al. | 707/103 Y |

FOREIGN PATENT DOCUMENTS

| | | |
|---|---|---|
| JP | 62-065804 A | 3/1987 |
| JP | 02-152802 A | 6/1990 |
| JP | 02-233403 A | 9/1990 |
| JP | 03-008602 A | 1/1991 |
| JP | 04-007204 A | 1/1992 |
| JP | 05-170314 A | 7/1993 |
| JP | 05-186005 A | 7/1993 |
| JP | 2009-002935 A | 1/2009 |
| JP | 2009-219748 A | 10/2009 |
| WO | 2008/047545 A1 | 4/2008 |

OTHER PUBLICATIONS

Official Communication issued in International Patent Application No. PCT/JP2009/006191, mailed on Feb. 9, 2010.

Official Communication issued in corresponding European Patent Application No. 09838736.8, mailed on Dec. 17, 2013.

* cited by examiner

AUTOMATED WAREHOUSE SYSTEM

BACKGROUND OF THE INVENTION

1. Field of the Invention

The present invention relates to an automated warehouse system, and more particularly, to an automated warehouse system including a storage station, a retrieval station, a plurality of shelves, and a moving device.

2. Description of the Related Art

A conventional automated warehouse system has, for example, a pair of racks, a stacker crane, and storage and retrieval stations. The two racks are arranged so as to have a prescribed spacing in-between in a front-to-rear direction. The stacker crane is arranged such that it can move freely in a transverse direction between the front and rear racks. The storage station is arranged at a side of one of the racks, and the retrieval station is arranged at a side of the other of the racks. The racks have multiple article storage shelves arranged vertically and horizontally. The stacker crane has a travel unit, a hoist unit moving up and down a mast provided on the travel unit, and an article transferring unit (e.g., a sliding fork arranged such that it can freely slide back and forth) provided on the hoist unit.

A known example of such an automated warehouse system is a stocker used to store FOUPs (front opening unified pods) in a semiconductor manufacturing plant. With the stocker, during storage, an overhead conveying vehicle carries a FOUP into the storage station and a stacker crane carries the FOUP to a prescribed shelf. During retrieval, the stacker crane carries a FOUP from a prescribed shelf to the retrieval station and the overhead conveying vehicle carries the FOUP away from the retrieval station.

Since a conveying performance of the stocker is lower than a conveying performance of the overhead conveying vehicle, the article conveying performance of the plant as a whole declines. Therefore, improvements have been made to a shelf determining method of the automated warehouse system in order to increase the conveying performance of the stocker.

A conventional automated warehouse shelf determining method will now be explained. The shelves of the automated warehouse system are divided into a plurality of blocks based on distances from the station to the shelves, and the articles that are stored and retrieved to and from the automated warehouse system are categorized based on a frequency of storage and retrieval in accordance with the number of the blocks. When articles are stored into the warehouse, articles having a high storage-retrieval frequency are assigned to a shelf in a block that is closer to the station. (See, for example, Japanese Laid-open Patent Publication No. 3-8602).

With the conventional automated warehouse shelf determining method explained above, it is necessary to acquire information related to the storage-retrieval frequency of the article in advance. Since it is necessary to obtain special information from other equipment, a cycle efficiency of storage and retrieval cannot be sufficiently increased in a conventional automated warehouse system.

SUMMARY OF THE INVENTION

Preferred embodiments of the present invention improve a cycle efficiency of storage and retrieval with respect to an automated warehouse system.

An automated warehouse system according to a preferred embodiment of the present invention includes a storage station, a retrieval station, a plurality of shelves, a moving device, and a controller. An article is stored in the storage station and retrieved from the retrieval station. The shelves store articles. The moving device can move an article between the storage station, the retrieval station, and the shelves. The controller keeps track of an amount of storage time that an article has been stored, and controls the moving device such that the moving device moves an article from a shelf located in a first area preset to be within a prescribed distance from the retrieval station to a shelf located in a second area that is farther from the retrieval station than the first area when the controller determines that the article has been stored on the shelf in the first area for at least a predetermined amount of time.

With this automated warehouse system, an article that has been stored on a shelf in the first area for at least the predetermined amount of time is carried to a shelf in the second area. As a result, the number of articles stored on shelves in the first area for long periods of time is reduced. Since articles are transported and stored according to a manufacturing schedule, articles that have been stored for a long period of time are likely to have been removed from the manufacturing schedule and are likely to be stored for an even longer period of time. The inventors focused on this new discovery in inventing the preferred embodiments of the present invention.

With the preferred embodiments of the present invention, during retrieval of an article, the likelihood that the article being retrieved is positioned on a shelf in the first area is higher, when compared with the prior art. As a result, a cycle efficiency of storing and retrieving articles to and from an automated warehouse system is improved.

In particular, an automated warehouse system according to various preferred embodiments of the present invention is advantageous in that the shelf position of an article can be determined without receiving information regarding the article from other equipment.

The shelves of the first area are preferably closer to the retrieval station than the shelves of the second area at least on average. That is, it is acceptable if the first area includes a shelf that is farther from the retrieval station than a shelf in the second area.

It is preferable for the controller to check storage times of articles stored on shelves in the first area at regular intervals, and control the moving device to carry articles to shelves in the second area in order, based on when the storage time becomes equal to or longer than the predetermined amount of time.

In this automated warehouse system, articles are carried to shelves in the second area in order, based on when the storage time becomes equal to or longer than the predetermined amount of time. As a result, the articles are moved in an efficient manner. Particularly in the case of an automated warehouse system that operates twenty four hours a day, articles can be rearranged during periods between times when articles are stored and retrieved.

It is also preferable for the controller to keep track of a storage time of an article stored on a shelf in the second area, and control the moving device such that the moving device moves the article from the second area to a third area that is farther from the retrieval station than the second area when the controller determines that the article has been stored on the shelf in the second area for at least a second predetermined amount of time that is longer than the aforementioned predetermined amount of time.

With this automated warehouse system, when an article has been stored for at least the second predetermined amount of time, the article is carried from the shelf in the second area to a shelf in the third area. As a result, the storage-retrieval cycle efficiency is improved even further.

The shelves of the second area should be closer to the retrieval station than the shelves of the third area at least on average. That is, it is preferable if the second area includes a shelf that is farther from the retrieval station than a shelf in the third area.

It is also preferable if, in addition to keeping track of an inventory status of the selves in the first area, the controller shifts a border delineating the shelves of the first area and the shelves of the second area toward the second area when the number of vacant shelves in the first area becomes small.

With this automated warehouse system, the border between the shelves closest to the retrieval station and the shelves of the second area is determined in a dynamic manner such that a situation in which all of the shelves of the first area are occupied by articles can be prevented.

An automated warehouse system according to various preferred embodiments of the present invention improves an efficiency of storing and retrieving articles.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
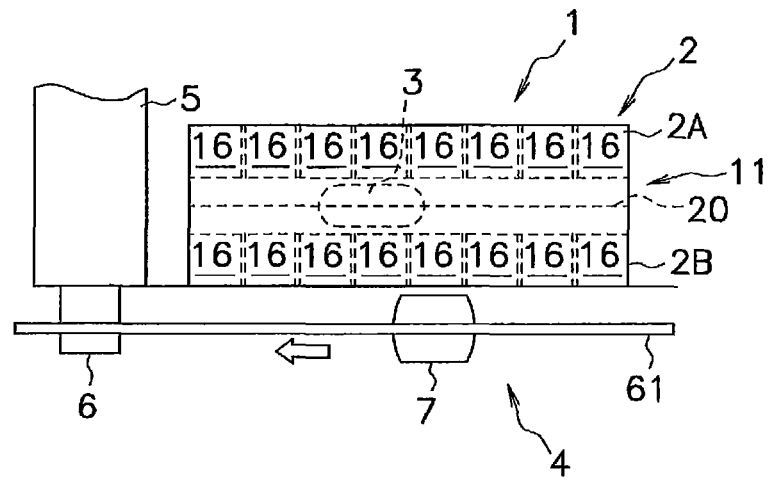
FIG. 1 is a partial schematic plan view of an automated warehouse system according to a preferred embodiment of the present invention.
Figure 2:
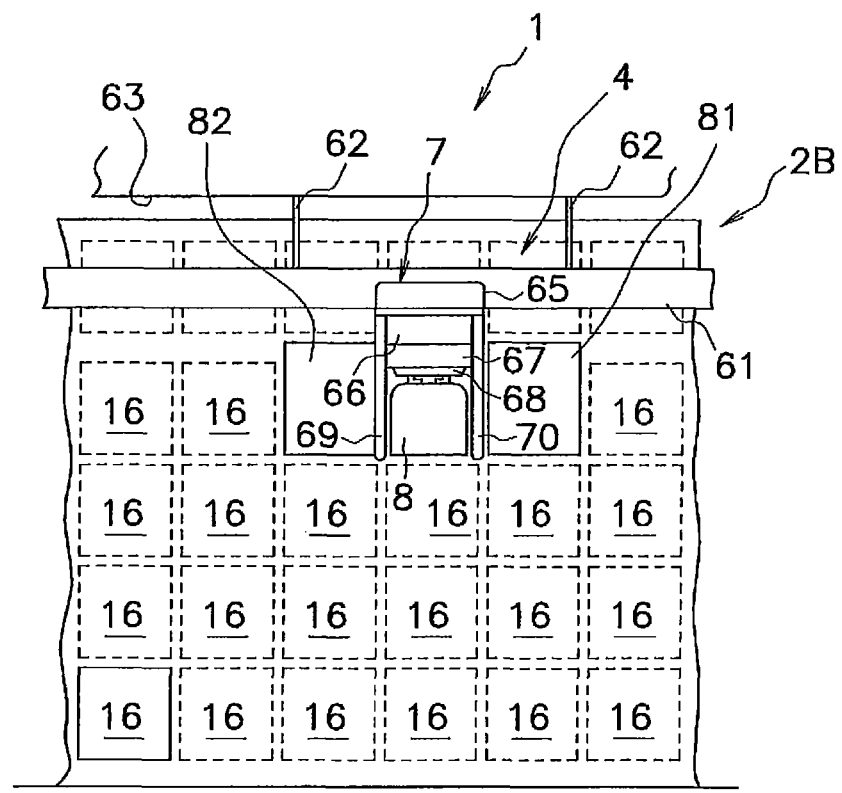
FIG. 2 is a partial side view of the automated warehouse system.

An automated warehouse system 1 according to a preferred embodiment of the present invention will now be explained with reference to FIGS. 1 and 2. FIG. 1 is a partial schematic plan view of an automated warehouse according to a preferred embodiment of the present invention. FIG. 2 is a partial side view of the automated warehouse.

The automated warehouse system 1 preferably includes a rack 2, a stacker crane 3, and an overhead conveying vehicle system 4. FIG. 1 also shows a processing apparatus 5 and a loading port 6. The overhead conveying vehicle system 4 includes an overhead conveying vehicle 7 that carries an article 8 (e.g., a FOUP) into the rack 2 of the automated warehouse system 1 and, if required, and carries an article 8 away from the rack 2 and delivers it to the loading port 6 of the processing apparatus 5.

The rack 2 preferably includes a first rack 2A and a second rack 2B. The first rack 2A and the second rack 2B are arranged with a stacker crane passageway 11 therebetween. The stacker crane passageway 11 extends in a left-right direction in FIG. 1. A plurality of article storage shelves 16 are provided on the first rack 2A and the second rack 2B. As is clear from the figures, articles 8 can be placed on the article storage shelves 16.

The overhead conveying vehicle system 4 will now be explained with reference to FIG. 2. The overhead conveying vehicle system 4 preferably includes a rail 61 and an overhead conveying vehicle 7 that travels along the rail 61.

As shown in FIG. 2, the rail 61 is suspended from a ceiling 63 with a plurality of columns 62. As is clearly shown in FIG. 1, the rail 61 is provided at and arranged to extend parallel or substantially parallel to an outward side of the second rack 2B (opposite side from the side facing the first rack 2A).

The overhead conveying vehicle 7 preferably includes a traveling section 65, a transverse movement section 66, a hoist driving section 67, a hoist table 68, a front cover 69, and a rear cover 70. The traveling section 65 includes a mechanism enabling the overhead conveying vehicle 7 to travel along the rail 61. The traveling section 65 includes an electric power receiving section (not shown), to which electric power from a pair of power supply lines is supplied. The hoist driving section 67 includes a mechanism arranged to vertically raise and lower the hoist table 68. The hoist table 68 holds an article 8. The transverse movement section 66 enables the hoist driving section 67 and the hoist table 68 to be moved along a direction perpendicular or substantially perpendicular to the direction in which the rail 61 extends.

Figure 3:
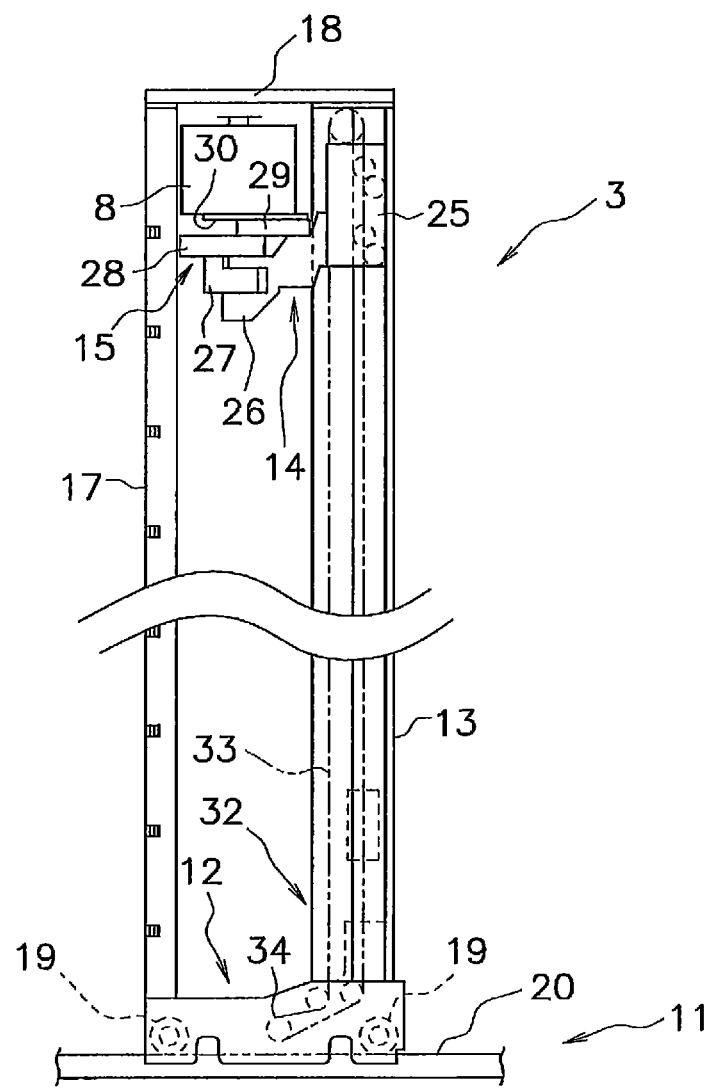
FIG. 3 is a side view of a stacker crane of the automated warehouse system.

The stacker crane 3 will now be explained with reference to FIG. 3. FIG. 3 is a side view of the stacker crane 3 of the automated warehouse.

The stacker crane 3 is guided such that it can move left and right along the stacker crane passageway 11. The stacker crane 3 preferably includes a travel unit 12, a mast 13 provided on the travel unit 12, a hoist table 14 mounted on the mast 13 and arranged so as to freely move up and down, and a transferring device 15 on the hoist table 14 to transfer the article 8.

The travel unit 12 includes wheels 19 to travel along an upper surface of a rail 20. The travel unit 12 also includes guide rollers (not shown in the figures) to use two side surfaces of the rail 20 as guide surfaces. The travel unit 12 further includes a travel motor 23 (FIG. 4) to rotate the wheels 19 and reduction gears (not shown).

The mast 13 is provided on an upper portion of the travel unit 12, in a position located to one side along the traveling direction. A ladder 17 is provided on the opposite side. An upper end of the mast 13 and an upper end of the ladder 17 are connected to each other with a frame 18.

The hoist table 14 includes a guide member 25 configured to be guided by the mast 13 and a support platform 26 that protrudes from the guide member 25 toward the ladder 17.

Figure 4:
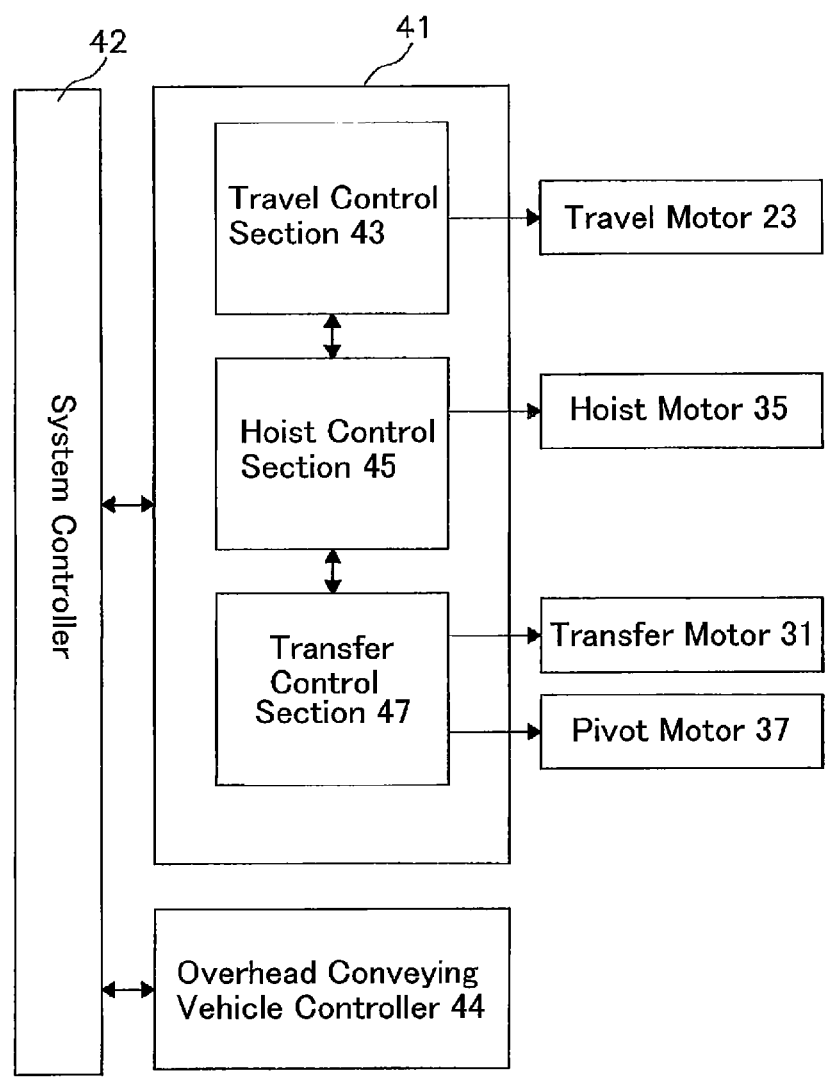
FIG. 4 is a block diagram showing a control configuration for the stacker crane.

A pivot arm 27 is provided on the support platform 26 of the hoist table 14. The pivot arm 27 serves as a device to turn the transferring device 15. The pivot arm 27 is driven by a pivot motor (FIG. 4).

The transferring device 15 includes a scalar arm type robot hand including a hand 28 to hold an article 8, a first arm 29, and a second arm 30. The hand 28, the first arm 29, and the second arm 30 are connected to a transfer motor 31 through reduction gears, a belt, or the like, for example.

A hoist driving section 32 preferably includes a belt 33 to drive the hoist table 14, a hoist pulley 34, and a hoist motor 35 (FIG. 4) to drive the hoist pulley 34.

A crane controller 41 for the stacker crane 3 and a system controller 42 will now be explained based on FIG. 4. The crane controller 41 is mounted on the stacker crane 3 and is configured such that it can communicate with the system controller 42, which controls the entire automated warehouse system 1. An overhead conveying vehicle controller 44 is also connected to the system controller 42.

The crane controller 41, the system controller 42, and the overhead conveying vehicle controller 44 each preferably include a CPU, a memory, and other computer hardware. In FIG. 4, these controllers are illustrated as functional blocks realized through the coordinated operation of computer hardware and software.

The crane controller 41 preferably includes a travel control section 43, a hoist control section 45, and a transfer control section 47. The travel control section 43 controls the traveling and stopping of the travel unit 12, and is connected to the travel motor 23 (FIG. 4) and a rotary encoder (not shown). The hoist control section 45 is a section that controls the raising and lowering of the hoist table 14 along the mast 13, and is connected to the hoist motor 35 (FIG. 4) and the rotary encoder (not shown). The transfer control section 47 drives the arms of the transferring device 15 and is connected to the transfer motor 31 (FIG. 4), a pivot motor 37, and a rotary encoder (not shown).

The system controller 42 can exchange signals with the crane controller 41 and the overhead conveying vehicle controller 44. A memory 48 is connected to the system controller 42. In the memory 48, information about arrangement conditions of articles 8 on the racks 2 and information that defines areas (explained later) within the racks 2 are stored. The system controller 42 refers to content in the memory 48 and, when necessary, updates the content.

An outward side of the article storage shelves 16 of the second rack 2B (the side facing the overhead conveying vehicle system 4) is closed. However, a storage station 81 and a retrieval station 82 are provided in two locations in place of article storage shelves 16 of the second rack 2B and the outward sides of the stations are open. In this preferred embodiment, the storage station 81 and the retrieval station 82 are in positions in place of article storage shelves 16 arranged in a second row and one article storage shelf 16 is provided between the two stations.

The storage station 81 and the retrieval station 82 are configured to have larger heights than the article storage shelves 16 by a certain level, such that the hoist driving section 67 and the hoist table 68 of the overhead conveying vehicle 7 can enter the inside thereof along with an article 8.

Figure 5:
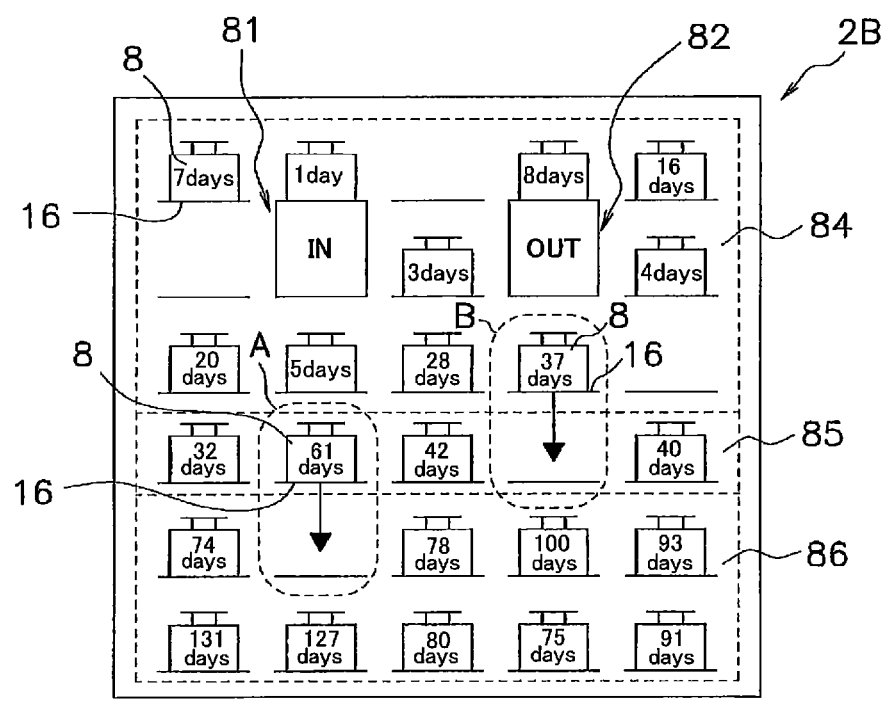
FIG. 5 is a sketch showing an arrangement of shelves in the automated warehouse system.

An arrangement of the racks 2 of the automated warehouse system 1 and method of moving articles 8 will now be explained with reference to FIG. 5. FIG. 5 is a sketch showing an arrangement of the second rack 2B of the automated warehouse system 1. In the explanation that follows, only the second rack 2B is mentioned for the sake of brevity. However, the same operations are performed with respect to both the first rack 2A and the second rack 2B in actual practice.

FIG. 5 shows a configuration in which six rows and five columns of article storage shelves 16 are preferably provided, for example. The rows are numbered from top to bottom, as a first row, a second row, a third row, a fourth row, a fifth row, and a sixth row. Meanwhile, the columns are numbered from left to right, as a first column, a second column, a third column, a fourth column, and a fifth column. The storage station 81 is arranged in a position corresponding to the second row and the second column. The retrieval station 82 is preferably arranged in a position corresponding to the second row and the fourth column.

In this preferred embodiment, the first through third rows of article storage shelves 16 define a buffer area 84 (first area), the fourth row of article storage shelves 16 define a first storage area 85 (second area), and the fifth and sixth rows of article storage shelves 16 define a second storage area 86. The buffer area 84 includes a group of article storage shelves 16 that are close to the retrieval station 82. The first storage area 85 includes a group of article storage shelves 16 that are far from the retrieval station 82. The second storage area 86 includes a group of article storage shelves 16 that are even farther from the retrieval station 82. Information defining the areas is stored in the memory 48.

The article storage shelves 16 of the buffer area 84 should be closer to the retrieval station 82 than the article storage shelves 16 of the first storage area 85 at least on average. That is, it is preferable if the article storage shelves 16 of the buffer area 84 include an article storage shelf 16 that is farther from the retrieval station 82 than an article storage shelf 16 of the first storage area 85.

The article storage shelves 16 of the first storage area 85 is preferably closer to the retrieval station 82 than the article storage shelves 16 of the second storage area 86 at least on average. That is, it is acceptable if the article storage shelves 16 of the first storage area 85 include an article storage shelf 16 that is farther from the retrieval station 82 than an article storage shelf 16 of the second storage area 86.

The number written on each of the articles 8 indicates the amount of time the article 8 has been stored, calculated at the current time.

Firstly, storage and retrieval operations will be explained.

Storage occurs when the overhead conveying vehicle 7 carries an article 8 into the storage station 81 of the second block 2B and, then, the stacker crane 3 carries the article 8 to a neighboring article storage shelf 16 and empties the storage station 81. At this point, the stacker crane 3 puts the article 8 on an article storage shelf 16 that is close to the storage station 81 (e.g., an article storage shelf 16 inside the buffer area 84). As a result, the length of time during which the stacker crane 3 strokes up and down is short and, thus, the cycle time of the stacker crane 3 is shortened.

Retrieval occurs when the stacker crane 3 carries an article 8 from an article storage shelf 16 to the retrieval station 82 and, then, the overhead conveying vehicle 7 carries the article 8 away from the retrieval station 82.

The system controller 42 stores in memory the time when an article 8 enters through the storage station 81. Thus, the system controller 42 can keep track of how long the article 8 has been stored with respect to the current time. The system controller 42 controls the stacker crane 3 to move articles 8 that have been stored on article storage shelves 16 located inside the buffer area 84 for an amount of time equal to or longer than a first prescribed amount of time (e.g., 30 days) to article storage shelves 16 located inside the first storage area 85. In this way, articles 8 that have been stored for a long time and are likely to remain stored for a long time can be arranged in positions farther from the retrieval station 82. As a result, vacant article storage shelves 16 located near the retrieval station 82 are increased and articles 8 that are likely to be retrieved at a comparatively early time can be stored on article storage shelves 16 located near the retrieval station 82. As a result, the cycle time of the automated warehouse system 1 can be shortened.

The system controller 42 also controls the stacker crane 3 to move articles 8 that have been stored on article storage shelves 16 located inside the first storage area 85 (second area) for an amount of time equal to or longer than a second prescribed amount of time (e.g., 60 days) to article storage shelves 16 located inside the second storage area 86 (third area). In this way, articles 8 that have been stored for a long time and are likely to remained stored for a long time can be arranged in positions even farther from the retrieval station 82. As a result, vacant article storage shelves 16 are created inside the first storage area 85.

The two types of article rearranging operations explained above are performed during periods between when articles are carried from the storage station 81 to the article storage shelves 16 and when articles are carried from the article storage shelves 16 to the retrieval station 82. Therefore, the articles can be rearranged efficiently in automated warehouse systems that have no idle time at night.

Moreover, if the present preferred embodiment is applied to an automated warehouse system that does have idle time during which articles are not stored and retrieved, be it nighttime or otherwise, it is also acceptable to check storage times and rearrange articles during the idle time.

Figure 6:
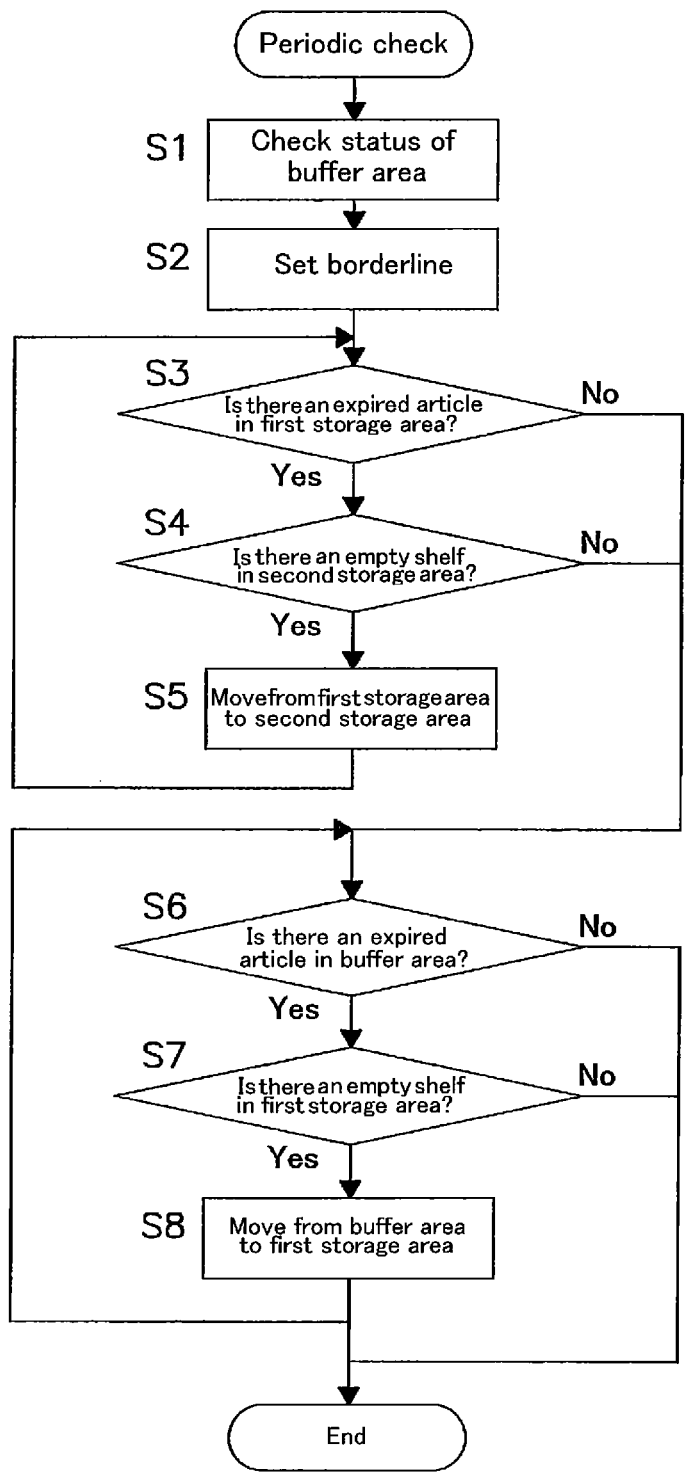
FIG. 6 is a flowchart explaining control operations for rearranging articles based on a periodic check executed by the automated warehouse system.

FIG. 6 is a flowchart explaining control operations for rearranging articles based on a periodic check executed by the automated warehouse system. Control operations are executed chiefly by the crane controller 41 and the system controller 42. These control operations are executed, for example, at regular intervals between storage and retrieval operations of the stacker crane 3. The control operations explained here are merely examples and various modifications are possible.

In step S1, the storage state of articles 8 in the buffer area 84 is checked.

In step S2, a border between the buffer area 84 and the first storage area 85 is set in accordance with storage state of the buffer area 84. More specifically, the buffer area 84 is enlarged if there is not a sufficient number of vacant article storage shelves 16 in the buffer area 84. Meanwhile, if there are too many vacant article storage shelves 16 in the buffer area 84, the size of the buffer area 84 is reduced. Finally, if the number of vacant article storage shelves 16 in the buffer area 84 is appropriate, the size of the buffer area 84 is maintained as it is.

It is also acceptable to set a border between the first storage area 85 and the second storage area 86 in step S2.

In step S3, it is determined if there is an article 8 in the first storage area 85 that has been stored for at least a second prescribed amount of time. If there is none, the process proceeds to step S6. If there is such an article 8 in the first storage area 85, the process proceeds to step S4.

In step S4, it is determined if there is a vacant article storage shelf 16 in the second storage area 86. If there is none, the process proceeds to step S6. If there is a vacant article storage shelf 16 in the second storage area 86, the process proceeds to step S5.

In step S5, the stacker crane 3 moves an article 8 that have been stored for an amount of time equal to or longer than the second prescribed amount of time from an article storage shelve 16 in the first storage area 85 to an article storage shelve 16 in the second storage are 86 (portion A of FIG. 5). Afterwards, the process returns to step S3.

In step S6, it is determined if there is an article 8 in the buffer area 84 that has been stored for an amount of time equal to or longer than the first prescribed amount of time. If there is none, the process ends the control sequence. If there is such an article 8 in the buffer area 84, the process proceeds to step S7.

In step S7, it is determined if there is a vacant article storage shelf 16 in the first storage area 85. If there is none, the process ends the control sequence. If there is a vacant article storage shelf 16 in the first storage area 85, the process proceeds to step S8.

In step S8, the stacker crane 3 moves an article 8 that has been stored for an amount of time equal to or longer than the first prescribed amount of time from an article storage shelve 16 in the buffer area 84 to an article storage shelve 16 in the first storage are 85 (portion B of FIG. 5). Afterwards, the process returns to step S6.

Figure 7:
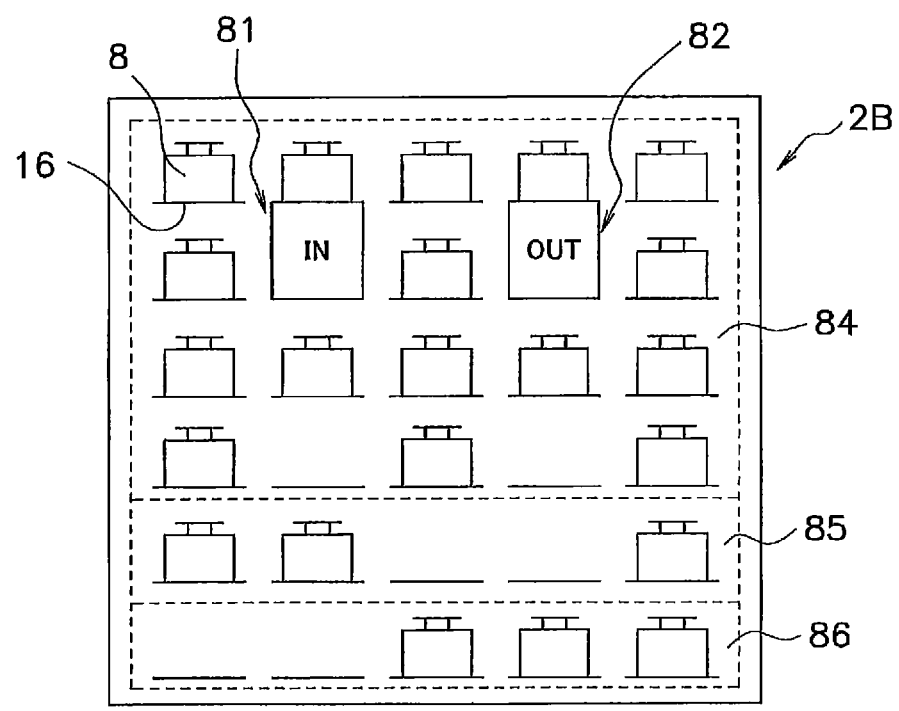
FIG. 7 is a sketch showing an arrangement of shelves in the automated warehouse.

FIG. 7 shows an example in which it is determined, in step S2, that there is not a sufficient number of vacant article storage shelves 16 in the buffer area 84 and, therefore, enlarges the buffer area 84. In this example, compared to the arrangement shown in FIG. 5, the second storage area 86 includes only the sixth row of the article storage shelves 16, the first storage area 85 includes only the fifth row of the article storage shelves 16, and the buffer area 84 has been expanded to include the first to fourth rows of the article storage shelves 16.

An automated warehouse system 1 according to a preferred embodiment of the present invention preferably includes a storage station 81, a retrieval station 82, a plurality of article storage shelves 16, a stacker crane 3, and a system controller 42. An article 8 is brought to the storage station 81 to be stored and an article 8 is retrieved from the retrieval station 82. The article storage shelves 16 stores articles 8. The stacker crane 3 can move an article 8 between the storage station 81, the retrieval station 82, and the article storage shelves 16. The system controller 42 keeps track of the amount of time the articles 8 have been stored and, when it determines that an article 8 has been stored on an article storage shelf 16 in the buffer area 84 for at least a first prescribed amount of time, the system controller 42 controls the stacker crane 3 such that the stacker crane 3 carries the article 8 from the buffer area 84 to an article storage shelf 16 in the first storage area 85.

Thus, with this automated warehouse system 1, an article 8 that has been stored on an article storage shelf 16 in the buffer area 84 for at least the first prescribed amount of time is moved to an article storage shelf 16 in the first storage area 85. As a result, the number of articles stored on shelves in the buffer area 84 for long periods of time is reduced. Since articles 8 are transported and stored according to a manufacturing schedule, articles that have been stored for a long period of time likely have been removed from the manufacturing schedule and are likely to be stored for an even longer period of time.

Thus, during retrieval of an article 8, the likelihood that the article 8 being carried to the retrieval station 82 by the stacker crane 3 is positioned on an article storage shelf in the buffer area 84 is higher, when compared with the prior art. As a result, the cycle efficiency of storing and retrieving articles to and from the automated warehouse system 1 is improved.

In particular, this automated warehouse system 1 is advantageous in that the shelf position of an article 8 can be determined without receiving information regarding the article 8 from other equipment.

The system controller 42 checks the amount of time the articles 8 have been stored on article storage shelves 16 in the buffer area 84 at regular intervals, and controls the stacker crane 3 to carry the articles 8 to article storage shelves 16 in the first storage area 85 in order, based on when the storage time becomes equal to or longer than the first prescribed amount of time.

With this automated warehouse system 1, articles 8 are carried to article storage shelves 16 in the first storage area 85 in order, based on when the storage times of the articles 8 become equal to or longer than the first prescribed amount of time. As a result, the articles 8 are moved in an efficient manner. Particularly in the case of an automated warehouse system 1 that operates twenty four hours a day, articles 8 can be rearranged during the period between times when articles are stored and retrieved.

The system controller 42 keeps track of the storage times of articles 8 stored on article storage shelves 16 in the first storage area 85. When the amount of time an article 8 has been stored becomes equal to or longer than a second prescribed amount of time, which is longer than the first prescribed amount of time, the system controller 42 controls the stacker crane 3 to carry the article 8 to an article storage shelf 16 located in the second storage area 86.

With this automated warehouse system 1, an article 8 is carried from an article storage shelf 16 in the first storage area 85 to an article storage shelf 16 in the second storage area 86 when the article 8 has been stored for at least the second prescribed amount of time. As a result, the storage-retrieval cycle efficiency is improved even further.

The system controller 42 keeps track of an inventory situation of the article storage shelves 16 in the buffer area 84. If the number of vacant article storage shelves 16 in the buffer area becomes small, the system controller 42 shifts the border delineating the buffer area 84 and the first storage area 85 toward the first storage area 85.

With this automated warehouse system 1, the border between the article storage shelves 16 in the buffer area 84 and the article storage shelves 16 in the first storage area 85 is determined in a dynamic manner such that a situation in which all of the article storage shelves 16 in the buffer area 84 are occupied by articles 8 can be prevented.

OTHER PREFERRED EMBODIMENTS

Preferred embodiments of the present invention have been described heretofore, but the present invention is not limited to the above-described preferred embodiments. Various changes can be made without departing from the scope of the present invention.

Although in the previously described preferred embodiments the automated warehouse system preferably includes one storage station and one retrieval station, the present invention is not limited to such a configuration. It is acceptable to have pluralities of storage stations and retrieval stations.

The sizes and shapes of the buffer area and storage areas presented in the previously described preferred embodiments are merely examples and do not limit the present invention.

Although each of the shelves is relegated to one of three areas in the previously described preferred embodiments, the present invention is not limited to such an arrangement. For example, it is acceptable to relegate each of the shelves to one of two areas or one of four areas or more.

Although in the previously described preferred embodiments the areas are preferably adjacent to one another, the present invention is not limited to such an arrangement. For example, it is acceptable to have shelves that are not relegated to any area to be arranged between two areas.

Preferred embodiments of the present invention are applicable to an automated warehouse system, particularly an automated warehouse system including a storage station, a retrieval station, a plurality of shelves, and a moving device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An automated warehouse system, comprising:
a storage station to which an article is brought to be stored;
a retrieval station from which the article is retrieved;
a plurality of shelves arranged to store the article;
a moving device configured to move the article between the storage station, the retrieval station, and the shelves; and
a controller programmed to keep track of an amount of storage time an article has been stored, and to control the moving device such that the moving device moves the article from a shelf located in a first area to a shelf located in a second area when the controller determines that the article has been stored on the shelf in the first area for at least a predetermined amount of time, the first area being defined to be within a prescribed distance from the retrieval station and the second area being farther from the retrieval station than the first area; wherein
the controller is programmed to keep track of an inventory situation of the shelves in the first area, and to shift a border delineating the shelves in the first area and the shelves in the second area toward the second area when a number of vacant shelves in the first area becomes insufficient, such that at least one shelf of the second area is re-assigned to the first area.

2. The automated warehouse system according to claim 1, wherein:
the controller is programmed to check storage times of articles stored on shelves in the first area at regular intervals, and to control the moving device to carry articles to shelves in the second area in order, based on when the storage times become equal to or longer than the predetermined amount of time.

3. The automated warehouse system according to claim 1, wherein:
the controller is programmed to keep track of a storage time of an article stored on a shelf in the second area, and to control the moving device such that the moving device moves the article from the second area to a third area when the controller determines that the article has been stored on the shelf in the second area for at least a second predetermined amount of time that is longer than the predetermined amount of time, the third area being farther from the retrieval station than the second area.

4. The automated warehouse system according to claim 2, wherein:
the controller is programmed to keep track of a storage time of an article stored on a shelf in the second area, and to control the moving device such that the moving device moves the article from the second area to a third area when the controller determines that the article has been stored on the shelf in the second area for at least a second predetermined amount of time that is longer than the predetermined amount of time, the third area being farther from the retrieval station than the second area.

* * * * *